United States Patent
Seo et al.

(10) Patent No.: US 10,468,611 B2
(45) Date of Patent: Nov. 5, 2019

(54) FLEXIBLE DISPLAY DEVICE WITH METALLIC MATERIAL PORTION INCLUDING RECESS AND METHOD OF MANUFACTURING THE SAME

(71) Applicant: Samsung Display Co., Ltd., Yongin-si (KR)

(72) Inventors: Ilhun Seo, Yongin-si (KR); Hojin Yoon, Yongin-si (KR); Daewoo Lee, Yongin-si (KR); Minseong Yi, Yongin-si (KR); Yunmo Chung, Yongin-si (KR); Miyeon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/656,732

(22) Filed: Jul. 21, 2017

(65) Prior Publication Data

US 2018/0040837 A1    Feb. 8, 2018

(30) Foreign Application Priority Data

Aug. 4, 2016 (KR) .......................... 10-2016-0099626

(51) Int. Cl.
  *H01L 51/00*   (2006.01)
  *H01L 27/32*   (2006.01)
  *H01L 51/52*   (2006.01)

(52) U.S. Cl.
  CPC ...... *H01L 51/0097* (2013.01); *H01L 27/3258* (2013.01); *H01L 27/3262* (2013.01); *H01L 27/3276* (2013.01); *H01L 51/5253* (2013.01); *H01L 2227/323* (2013.01); *H01L 2251/5338* (2013.01)

(58) Field of Classification Search
  CPC ............. H01L 51/0097; H01L 27/3262; H01L 27/3276; H01L 51/5253; H01L 2227/323; H01L 2251/5338
  USPC ....................... 257/40; 438/82, 99
  See application file for complete search history.

(56) References Cited

U.S. PATENT DOCUMENTS 8,921,139 B2    12/2014  Lee
2005/0110023 A1*  5/2005  Lee .................... H01L 27/3276
                                        257/72

(Continued)

FOREIGN PATENT DOCUMENTS

KR    10-2013-0107116    10/2013
KR    10-2014-0015038    2/2014

(Continued)

*Primary Examiner* — Didarul A Mazumder
(74) *Attorney, Agent, or Firm* — H.C. Park & Associates, PLC

(57) ABSTRACT

A display device and method of manufacturing the device that facilitates exposing a pad includes a flexible substrate including a central area and a peripheral area surrounding the central area, a display unit in the central area, an encapsulation layer covering the display unit and including at least one inorganic layer and at least one organic layer, an insulating layer disposed in the peripheral area defining a recess having a bottom and side portions, and a reinforcing portion disposed inside the recess, including a metallic material, and covering at least a part of the bottom and side portions of the recess.

11 Claims, 19 Drawing Sheets

(56) References Cited

U.S. PATENT DOCUMENTS

| | | | |
|---|---|---|---|
| 2005/0266763 A1* | 12/2005 | Kimura | H01L 51/0005 445/24 |
| 2008/0224599 A1* | 9/2008 | Kim | H01L 27/3258 313/504 |
| 2008/0231175 A1* | 9/2008 | Sung | H01L 51/5237 313/504 |
| 2009/0021154 A1* | 1/2009 | Aota | H01L 27/3258 313/504 |
| 2011/0140163 A1* | 6/2011 | Oh | H01L 51/5256 257/100 |
| 2013/0112984 A1* | 5/2013 | Kim | H01L 51/0096 257/72 |
| 2013/0248826 A1 | 9/2013 | Kim et al. | |
| 2014/0151671 A1 | 6/2014 | Saitou et al. | |
| 2014/0319554 A1* | 10/2014 | Lee | B29C 65/487 257/91 |
| 2015/0060778 A1* | 3/2015 | Kim | H01L 27/3258 257/40 |

FOREIGN PATENT DOCUMENTS

| | | |
|---|---|---|
| KR | 10-2014-0048225 | 4/2014 |
| KR | 10-2014-0130894 | 11/2014 |
| KR | 10-2016-0054867 | 5/2016 |

\* cited by examiner

FLEXIBLE DISPLAY DEVICE WITH METALLIC MATERIAL PORTION INCLUDING RECESS AND METHOD OF MANUFACTURING THE SAME

CROSS-REFERENCE TO RELATED APPLICATION

This application claims priority from and the benefit of Korean Patent Application No. 10-2016-0099626, filed on Aug. 4, 2016, which is hereby incorporated by reference for all purposes as if fully set forth herein.

BACKGROUND

Field

The invention relates generally to flexible display devices and methods of manufacturing the same, and, more particularly, to a flexible display devices having a protective film covering a pad and a method of manufacturing the flexible display device that facilitates exposing the pad for testing.

Discussion of the Background

Since organic light-emitting diode displays have excellent characteristics with respect to features such as a viewing angle, contrast, response speeds, and power consumption, uses of organic light-emitting diode displays have expanded from personal mobile apparatuses such as MP3 players and mobile phones to TVs. Also, since organic light-emitting diode displays have self-illuminating properties, they do not require a separate light source and thus may reduce the thickness and weight of such displays.

Recently, research into flexible display devices which may be folded or rolled up into a compacted shape has been actively conducted. Flexible display devices are often thinner than conventional, inflexible displays, which may complicate manufacturing and produce reliability issues.

The above information disclosed in this Background section is only for enhancement of understanding of the background of the inventive concepts, and, therefore, it may contain information that does not form the prior art that is already known in this country to a person of ordinary skill in the art.

SUMMARY

In a flexible display device, a protective film protecting an upper portion of the flexible display device may be used during the manufacturing process. A process of removing at least a portion of the protective film may be performed, e.g., to expose a pad for testing elements of the device such as a mother substrate, for example. While at least a portion of the protective film is removed, layers forming the flexible display device, for example, insulating layers, a flexible substrate, and so on, may be exfoliated or damaged.

Flexible display devices and methods of manufacturing the same according to the principles of the invention may reduce or completely eliminate the problem of exfoliation or damage to various layers when a portion of a protective film is removed.

Additional aspects will be set forth in part in the description which follows and, in part, will be apparent from the description, or may be learned by practice of the inventive concepts.

According to one aspect of the invention, a display device includes a flexible substrate including a central area and a peripheral area surrounding the central area, a display unit in the central area, an encapsulation layer covering the display unit and including at least one inorganic layer and at least one organic layer, an insulating layer disposed in the peripheral area and having a recess, and a reinforcing portion disposed inside the recess, the reinforcing portion includes a metallic material and covers at least a part of a slope surface of the recess.

The reinforcing portion may be adjacent to an edge of the flexible substrate.

A portion of the insulating layer adjacent the recess may be a thermally denaturalized portion.

The display device may further include an additional insulating layer below the reinforcing portion, the reinforcing portion contacts an upper surface of the additional insulating layer.

The display device may further include a protective film disposed over the flexible substrate and covering the encapsulation layer.

The protective film may have an opening adjacent to the reinforcing portion.

The display device may further include a pad in the peripheral area, the pad being exposed via the opening of the protective film.

The display unit may include a pixel circuit including a thin film transistor and a storage capacitor, the thin film transistor including a semiconductor layer, a gate electrode, a source electrode, and a drain electrode, and the storage capacitor including a first electrode and a second electrode, and a display element connected to the pixel circuit.

The reinforcing portion comprises the same material as that of at least one of the gate electrode, the source electrode, the drain electrode, and the first electrode, and the second electrode.

The display unit may include a plurality of pixels each including an organic light-emitting diode.

According to another aspect of the invention, a method of manufacturing a display device includes the steps of forming a display unit in a central area of a flexible substrate, forming a pattern portion including a metallic material in a peripheral area of the flexible substrate, forming an insulating layer covering the pattern portion, forming an encapsulation layer including at least one inorganic layer and at least one organic layer over the display unit, and irradiating a laser beam at a portion of the insulating layer corresponding to the pattern portion to form a recess in the insulating layer and melt at least a part of the pattern portion.

In the step of forming the pattern portion, the pattern portion is adjacent to an edge of the flexible substrate.

The method may further include forming a lower insulating layer below the pattern portion, wherein in the step of irradiating of the laser beam, the pattern portion directly contacts a side surface of the recess and the lower insulating layer.

The method may further include forming a protective film at least partially covering the flexible substrate, and removing at least a part of the protective film and exposing at least a part of the peripheral area adjacent to the pattern portion.

The method may further include forming a pad in the peripheral area, wherein the pad is exposed during the step of removing of the at least the part of the protective film.

The step of forming a protective film at least partially covering the flexible substrate may include forming a protective film completely covering the flexible substrate.

The step of irradiating the laser beam at the portion of the insulating layer corresponding to the pattern portion includes forming the recess of the insulating layer to have a generally concave shape.

The step of irradiating the laser beam at the portion of the insulating layer corresponding to the pattern portion further includes melting at least a part of the pattern portion, the melting pattern portion may cover at least a part of the slope surface of the recess.

A process and a display device according to embodiments may prevent exfoliation of the insulating layers by using the pattern portion formed while the pattern portion is melted and hardened. Also, the process and the display device may prevent exfoliation or damage of the protective film and layers therebelow (e.g. the insulating layer, the flexible substrate, etc.). However, the scope of the disclosure is not limited by this effect.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
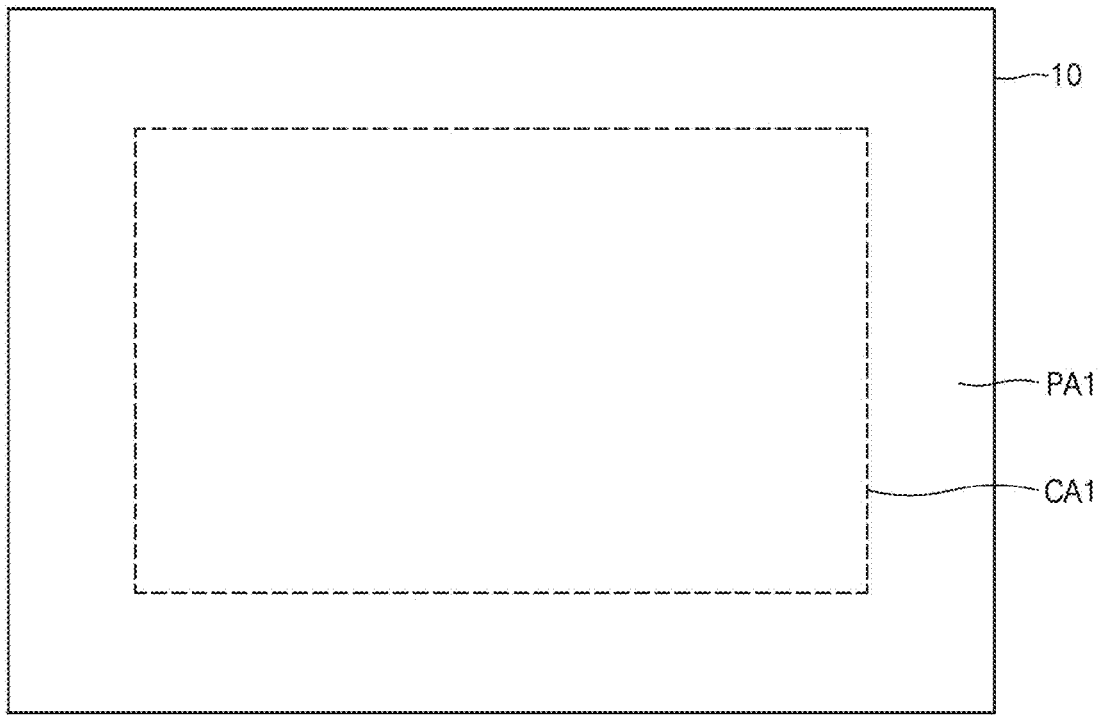
FIGS. 1 to 7 are plan views of a first embodiment of a flexible display device during various exemplary steps in a first embodiment of a method of manufacturing the flexible display device according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Referring to FIG. 1, a flexible substrate 10 is prepared. The flexible substrate 10 may include a flexible plastic material such as polyimide (PI) or polyethersulphone (PES), polyacrylate (PAR), polyetherimide (PEI), polyethylene naphthalate (PEN), polyethylene terephthalate (PET), polyphenylene sulfide (PPS), polyallylate, polycarbonate (PC), tri-acetyl cellulose (TAC), cellulose acetate propionate (CAP), cyclic olefin polymer, or cyclic olefin copolymer.

The flexible substrate 10 may include a single layer including the above-mentioned plastic material. Alternatively, the flexible substrate 10 may include a multi-layer such as a double layer including the above-mentioned plastic material, or may include a multi-layer including the plastic material with a barrier layer such as SiOx or SiNx therebetween.

Figure 2:
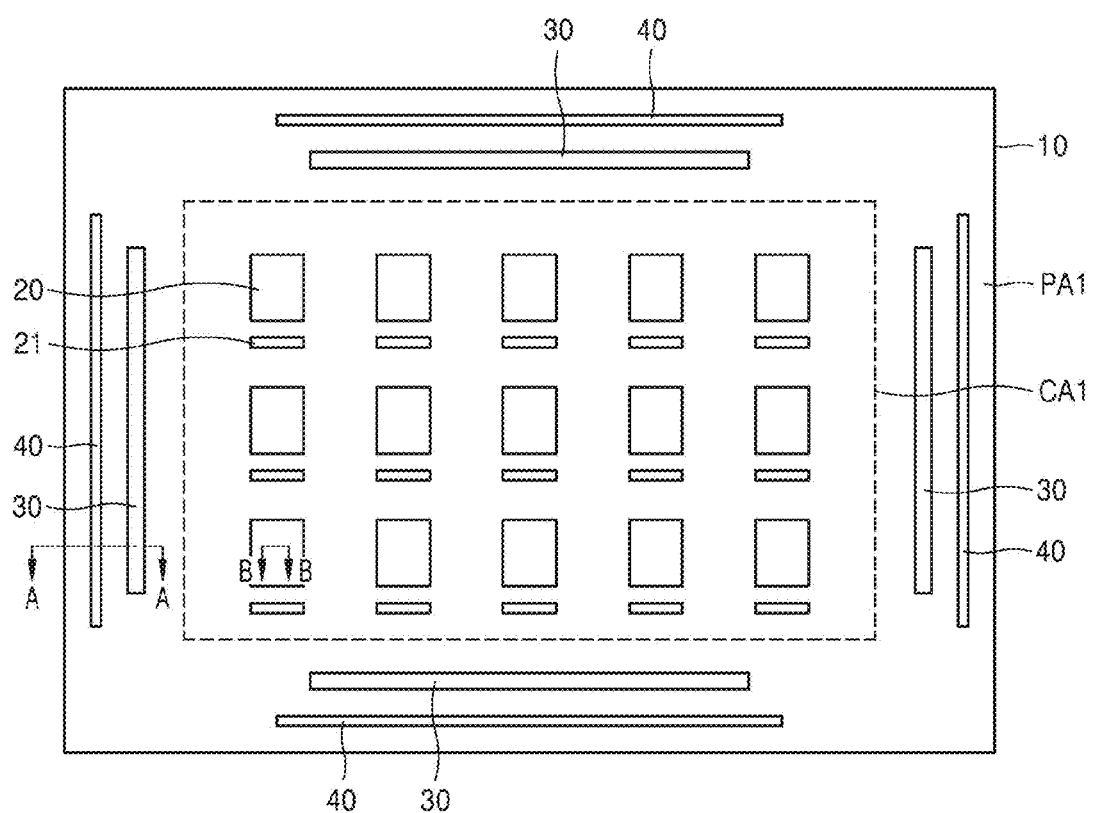

Referring to FIG. 2, the flexible substrate 10 includes a central area CA1 and a peripheral area PA1. The flexible substrate 10 is a mother substrate. A plurality of display units 20 and a plurality of pads 21 (referred to as first pads) adjacent to the plurality of display units 20, respectively, may be in the central area CA1 of the flexible substrate 10. Pads 30 (referred to as second pads) and pattern portions 40 may be in the peripheral area PA1.

Each display unit 20 includes a configuration of a plurality of pixels which may produce an image. Each first pad 21 may be a pad connecting each display unit 20 to a printed circuit board, for example, a flexible printed circuit board (FPCB). Each second pad 30 may be a pad for testing a mother substrate and/or for testing the display units 20.

Each of the display unit 20, the first pad 21, the second pad 30, and the pattern portion 40 may be formed by a method of manufacturing as detailed below.

Figure 8:
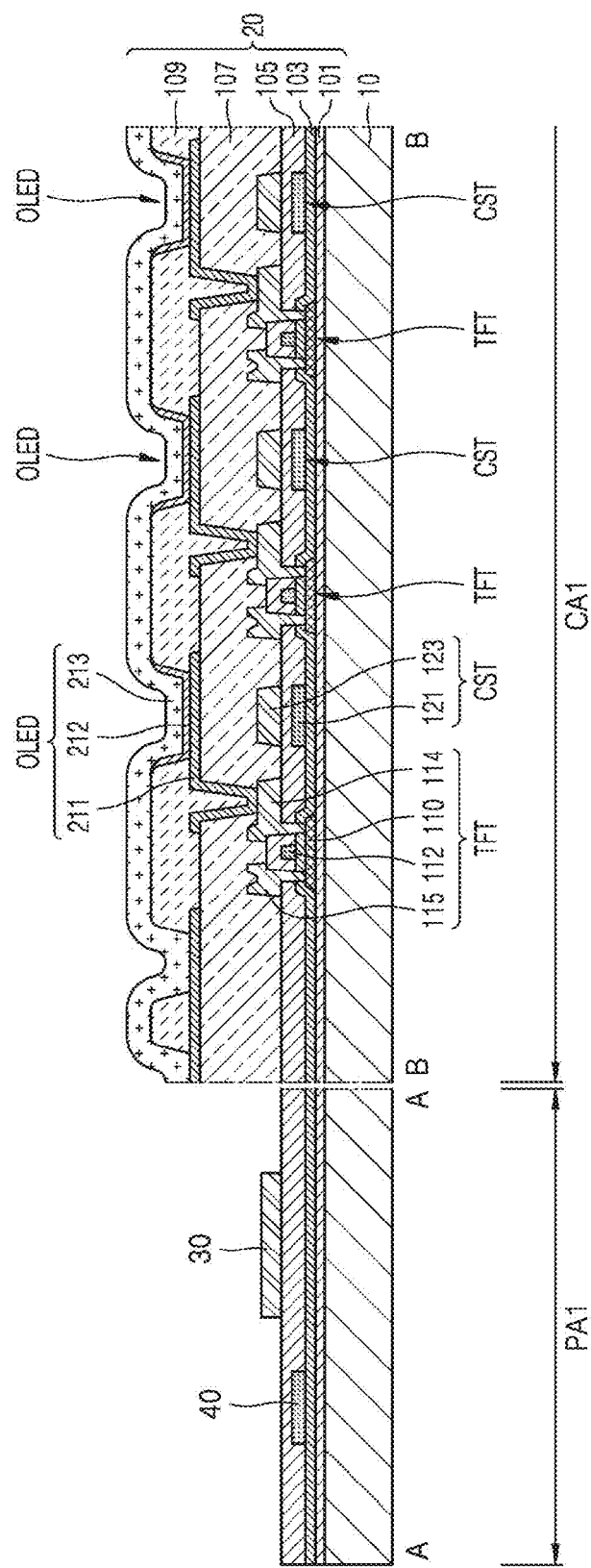
FIG. 8 is a cross-sectional view of the first embodiment of the flexible display device during an intermediate step according to the first embodiment of the method of manufacturing the flexible display device, taken along sectional lines A-A and B-B of FIG. 2.

First, referring to FIGS. 2 and 8, as shown best in FIG. 8, a pixel circuit includes a thin film transistor (TFT) and a storage capacitor Cst. The TFT, storage capacitor, and a display element such as an organic light-emitting device (OLED) are disposed in the central area CA1 of the flexible substrate 10. The pixel electrode 211 is electrically connected to the TFT and the storage capacitor Cst, and includes a pixel electrode 211, an emission layer 212 on the pixel electrode 211 exposed via a pixel-defining layer 109, and an opposite electrode 213. Various insulating layers are between these elements. For example, a buffer layer 101 preventing impurities from penetrating into a semiconductor layer 110 of the TFT may be on the flexible substrate 10, the buffer layer 101 including an inorganic material such as SiOx and/or SiNx. A gate insulating layer 103 insulating the semiconductor layer 110 of the TFT from a gate electrode 112 may be positioned over the flexible substrate 10, the gate insulating layer 103 including an inorganic material such as SiOx and/or SiNx. An interlayer insulating layer 105 insulating a drain electrode 114 and a source electrode 115 from the gate electrode 112 of the TFT may be positioned over the flexible substrate 10, the interlayer insulating layer 105 including an inorganic material such as SiOx and/or SiNx and/or an organic material. A planarization layer 107 covering the TFT and including a substantially flat upper surface may be positioned over the flexible substrate 10, the planarization layer 107 including an inorganic material or an organic material. The first pad 21 may include the same material as that of at least one of the electrodes of the TFT and the storage capacitor Cst and may thus be formed during the same step in the method of manufacturing the display as that of the at least one of the TFT and the storage capacitor Cst formed of the same material.

The second pad 30 and the pattern portion 40 are in the peripheral area PA1 of the flexible substrate 10 and include a metallic material. For example, each of the second pad 30 and the pattern portion 40 may include the same material as that of one of the gate electrode 112, the drain electrode 114, the source electrode 115 of the TFT, a first electrode 121, and a second electrode 123 of the storage capacitor Cst. The pattern portion 40 may include a single layer or a multi-layer including, for example, Mo, Al, Cu, or Ti.

The second pad 30 and the pattern portion 40 may include different materials and may be in different layers. For example, one of the second pad 30 and the pattern portion 40 may include the same material as the material of the gate electrode 112 and the first electrode 121, and the other of the second pad 30 and the pattern portion 40 may include the same material as the material of the drain electrode 114, the source electrode 115, and the second electrode 123. Alternatively, the second pad 30 and the pattern portion 40 may be in the same layer and include the same material. Hereinafter, for convenience of description, a case will be described where the second pad 30 includes the same material as the material of the drain electrode 114, the source electrode 115, and the second electrode 123, and where the pattern portion 40 includes the same material as the material of the gate electrode 112 and the first electrode 121.

The pattern portion 40 may include Mo, Al, Cu, or Ti and include a single layer or a multi-layer.

Figure 3:
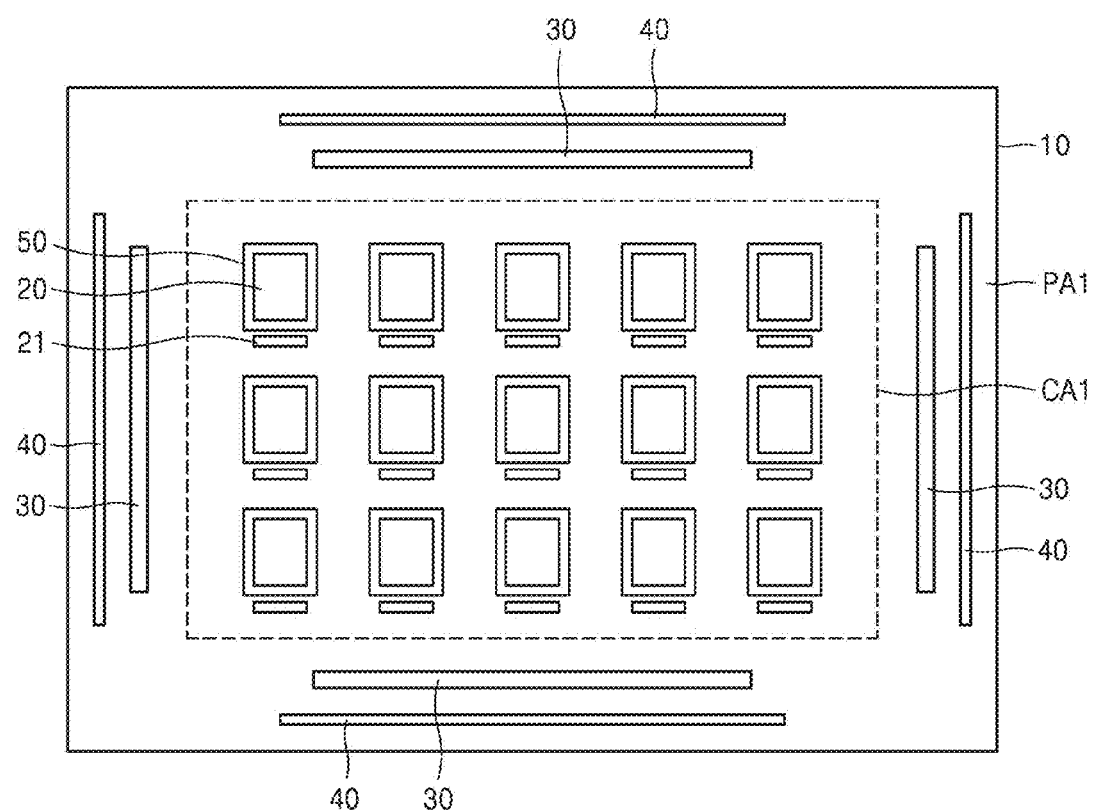
Figure 9:
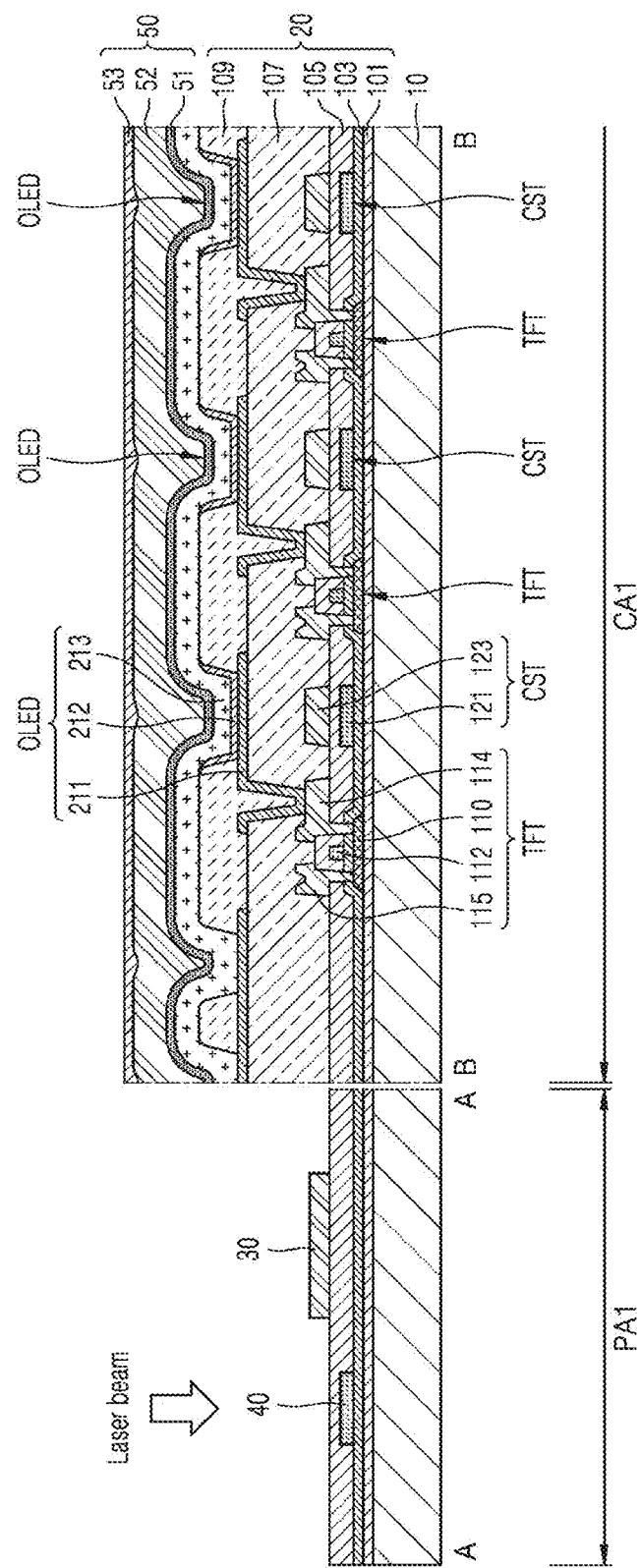
FIGS. 9 to 13 are cross-sectional views of the first embodiment of the flexible display device during various steps of the first embodiment of the method of manufacturing the flexible display device according to the principles of the invention.

Next, referring to FIG. 3 and FIG. 9, an encapsulation thin layer 50 is formed over each display unit 20. The encapsulation thin layer 50 is for sealing each display unit 20 and is not provided in the peripheral area PA1 of the flexible substrate 10. The encapsulation thin layer 50 includes at least one inorganic layer and at least one organic layer.

Referring to the embodiment of FIG. 9, the encapsulation thin layer 50 may include an organic layer 52 between a first inorganic layer 51 and a second inorganic layer 53. In another embodiment, the number, stacking order, and stacking frequency of inorganic layers and organic layers may be altered from the foregoing configuration.

Figure 10:
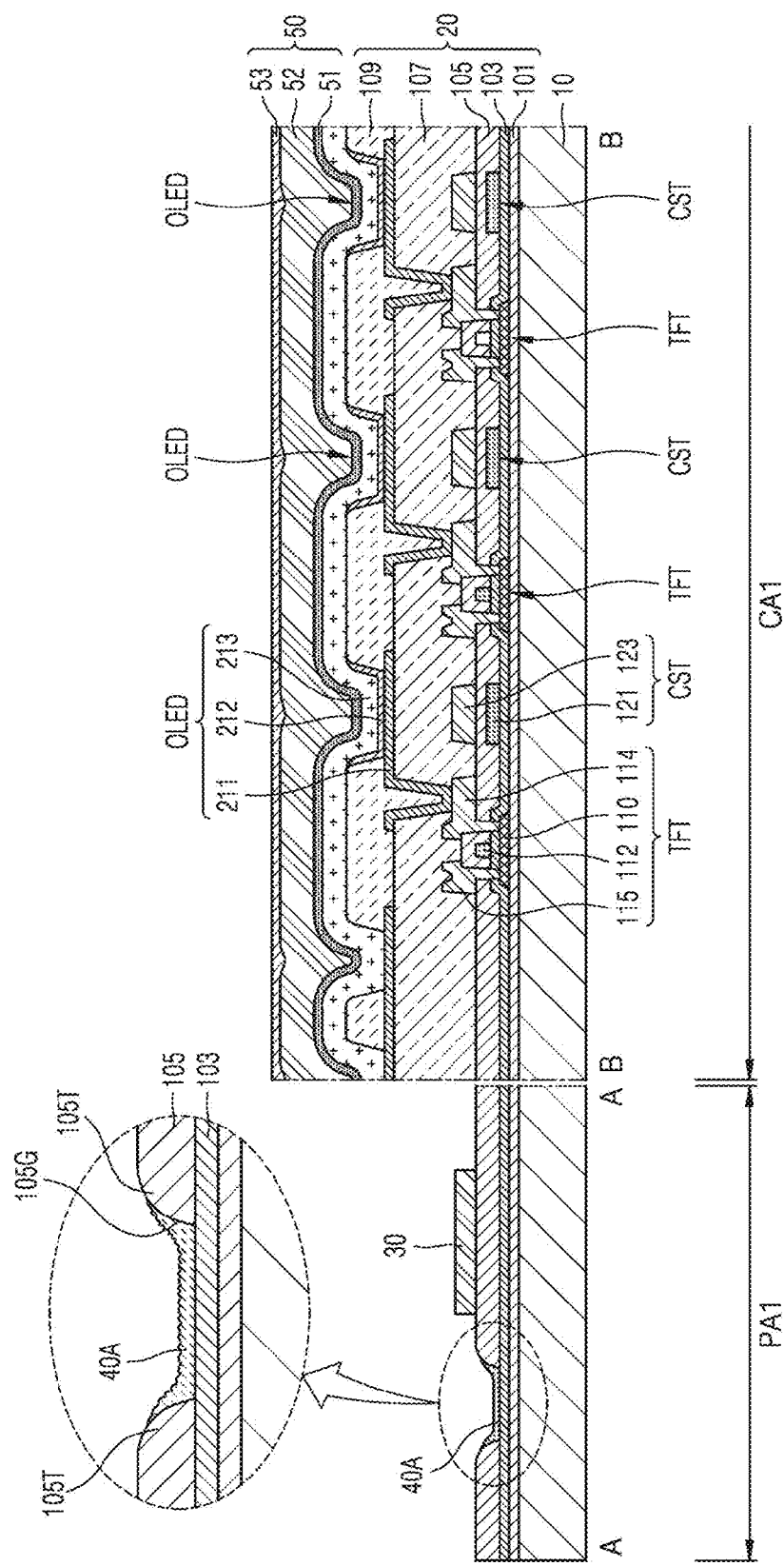

Referring to FIGS. 9 and 10, a laser beam is irradiated in the peripheral area PA1 corresponding to the pattern portion 40. While a portion of the interlayer insulating layer 105 evaporates due to high heat of the laser beam, a recess, which may be in the form of a concave portion 105G, may be formed and the pattern portion 40 may be melted by the laser beam. A part of the interlayer insulating layer 105 adjacent to the concave portion 105G may include a portion 105T, which is re-shaped by the high heat of the laser beam.

Figure 14:
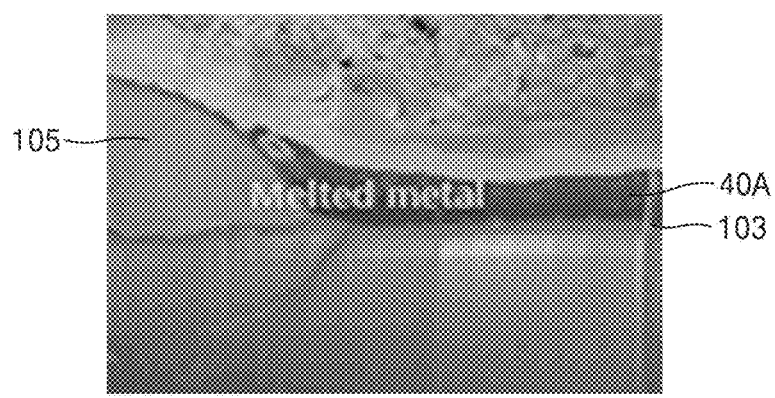
FIG. 14 is a photograph of a cross-section of a peripheral area of a flexible display device constructed according to the principles of the invention.

A melted pattern portion 40A covers the sloped side surfaces of the concave portion 105G, moves upwardly along the sloped sides, and then is hardened. The sloped sides are those touched by the lead line for the concave portion 105G in FIG. 10, for example. The sloped sides may be a continuous surface if, e.g., the concave portion 105G has a generally circular shape in plan, but may also include multiple sloped sides, e.g., if the concave portion has 105G a generally polygonal shape in plan. Thus, if the concave portion 105G has a rectangular shape in plan, it would have four sloped sides, if it has a triangular shape in plan, it would have three sloped sides, and so forth. The hardened pattern portion 40A forms a reinforcing portion that may have an irregular shape, as illustrated in the photographic image of FIG. 14.

Figure 15:
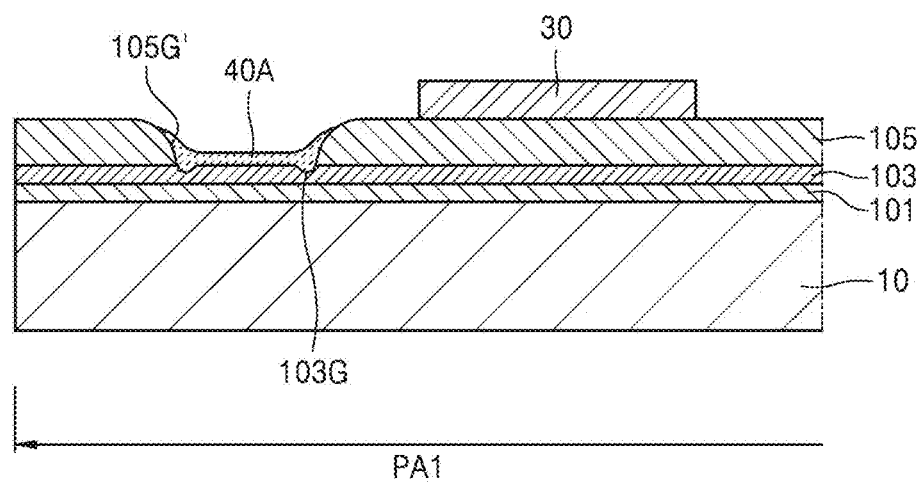
FIG. 15 is a cross-sectional view of a peripheral area of a second embodiment of a flexible display device constructed according to the principles of the invention.

Though the concave portion 105G is formed in an insulating layer, for example, the interlayer insulating layer 105 on the pattern portion 40 as the laser beam is irradiated, other configurations are permissible. For example, referring to the embodiment of FIG. 15, a concave portion 105G' may also be formed in an insulating layer, for example, the gate insulating layer 103 under the pattern portion 40, depending on a size, an irradiation location, a power, and so on, of the laser beam.

Figure 4:
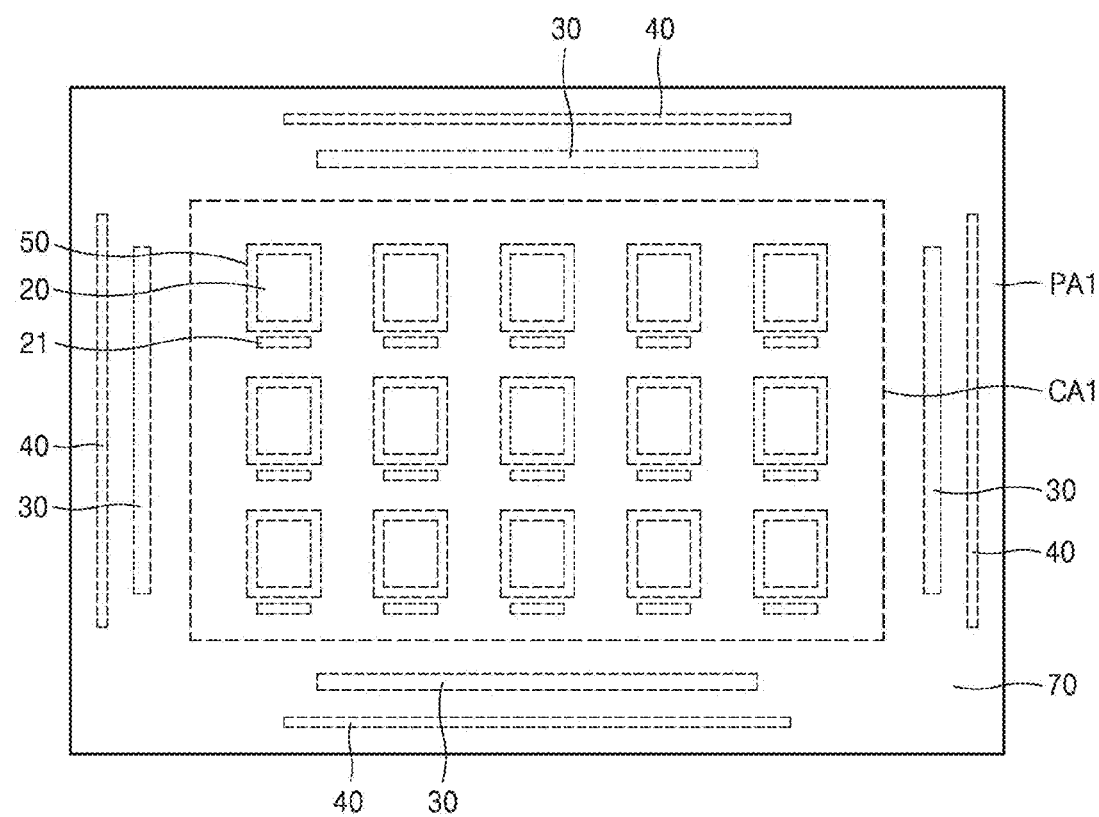
Figure 11:
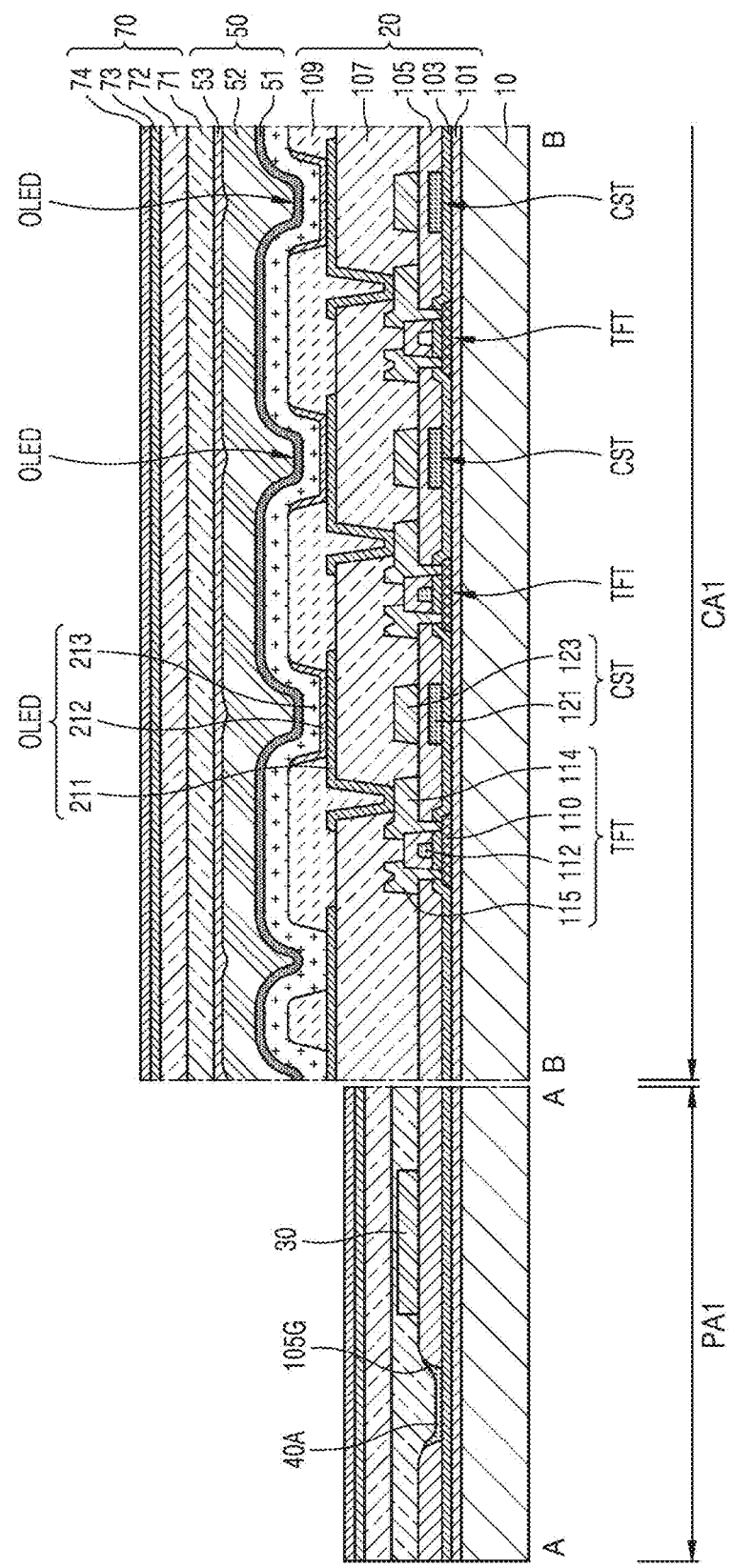

Referring to FIG. 4 and FIG. 11, a protective film 70 is formed over the flexible substrate 10. The protective film 70 may partially or completely cover the central area CA1 and the peripheral area PA1 of the flexible substrate 10.

Referring to FIG. 11, the protective film 70 may include a plastic material. For example, the protective film 70 may include a plurality of film layers including a plastic material such as PET. For example, the protective film 70 may include a first film layer 72 and a second film layer 74. The first film layer 72 and the second film layer 74 may be arranged over the encapsulation thin layer 50 by using a first adhesive layer 71 and a second adhesive layer 73. The first film layer 72 may have a thickness of about 75 μm, the second film layer 74 may have a thickness of about 25 μm, the first adhesive layer 71 may have a thickness of about 75 μm, and the second adhesive layer 73 may have a thickness of about 25 μm.

Though a case where the protective film 70 includes PET has been described, the protective film 70 may also, or alternatively, include PES, PAR, PEI, PEN, PPS, PI, PC, TAC, CAP, polyallylate, cyclic olefin polymer, or cyclic olefin copolymer.

Figure 5:
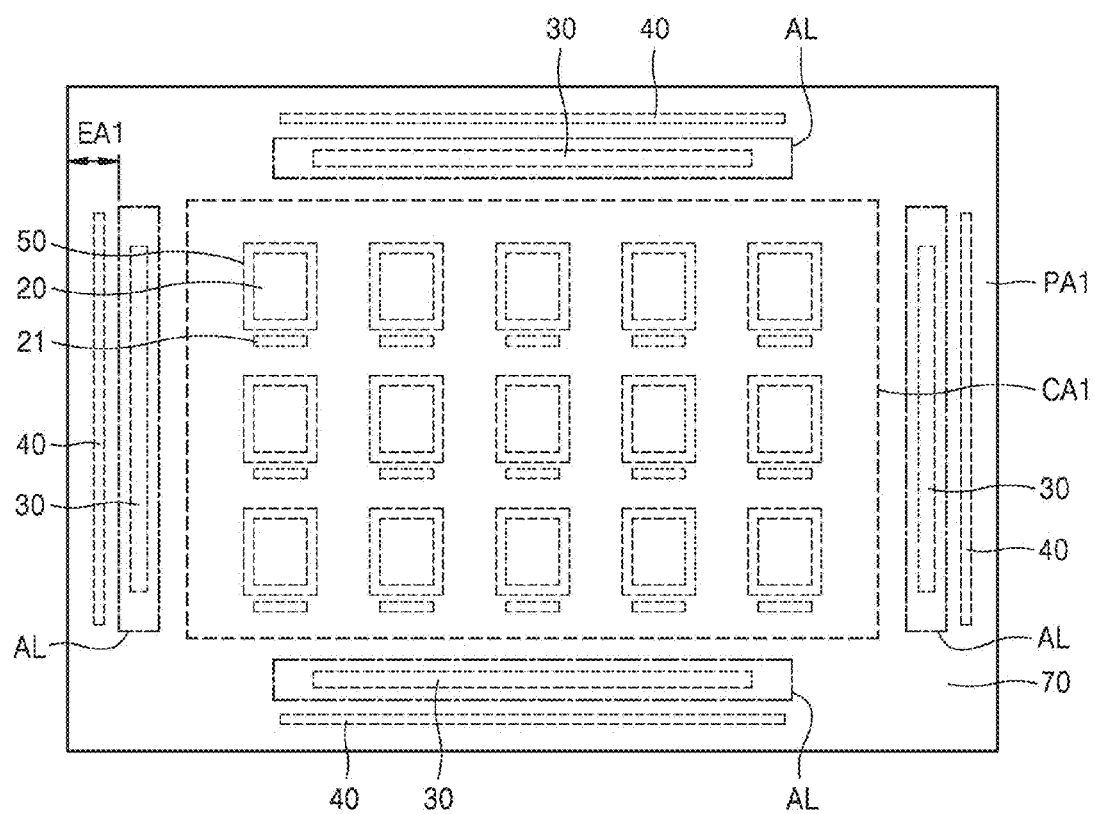
Figure 12:
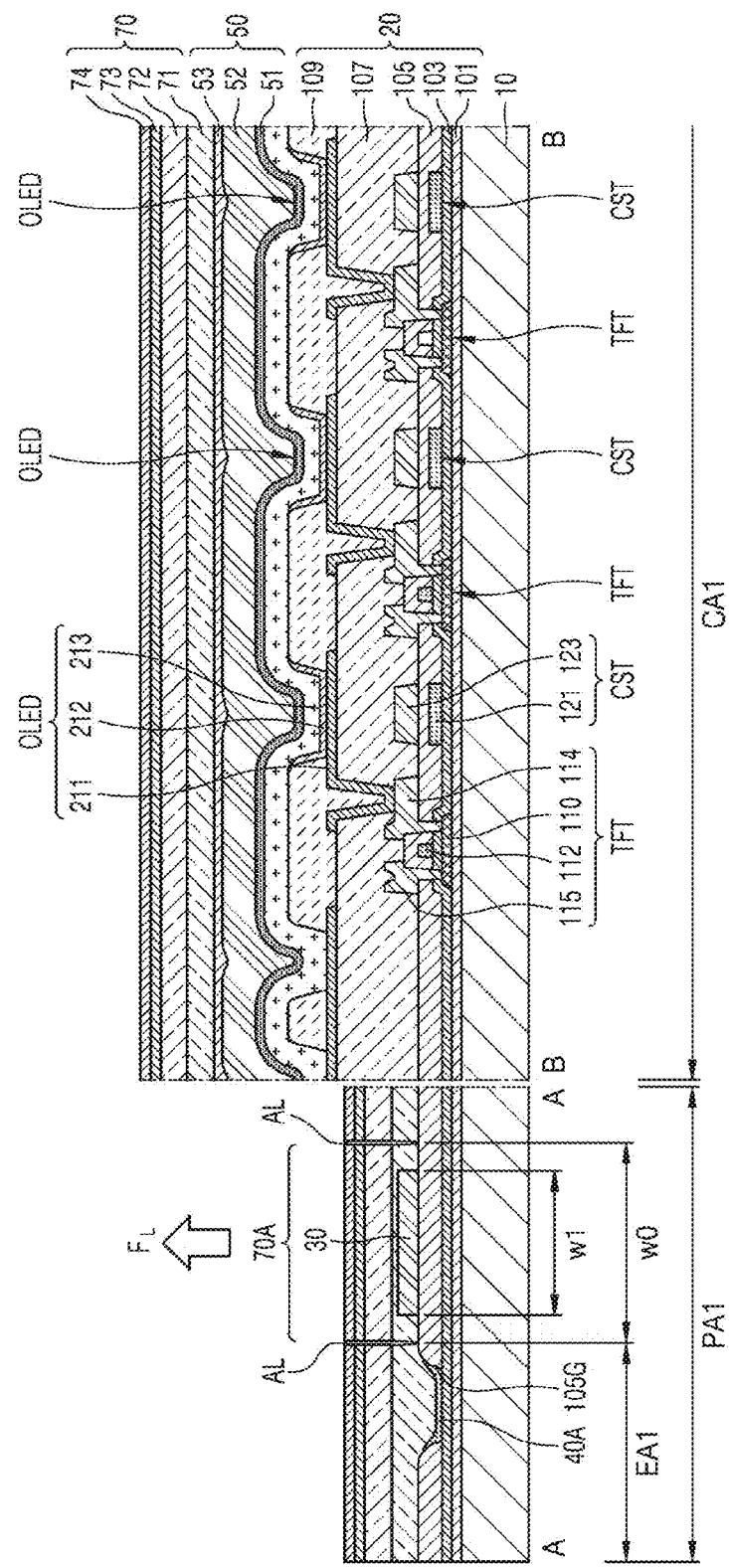

Referring to FIG. 5 and FIG. 12, an auxiliary line AL is formed in a part of the protective film 70 by using a blade or a laser cutter, or other means known in the art. The auxiliary line AL surrounds the second pad 30 below the protective film 70 and may be formed as a dashed line as shown in FIG. 5 or, alternatively, may be formed as a solid line. In either event, at least a portion 70A of the protective film 70 defined by the auxiliary line AL overlaps the second pad 30.

Referring to FIG. 12, the auxiliary line AL passes through the protective film 70. The portion 70A of the protective film 70 defined by the auxiliary line AL has a width w0 equal to or greater than a width w1 of the second pad 30.

Figure 6:
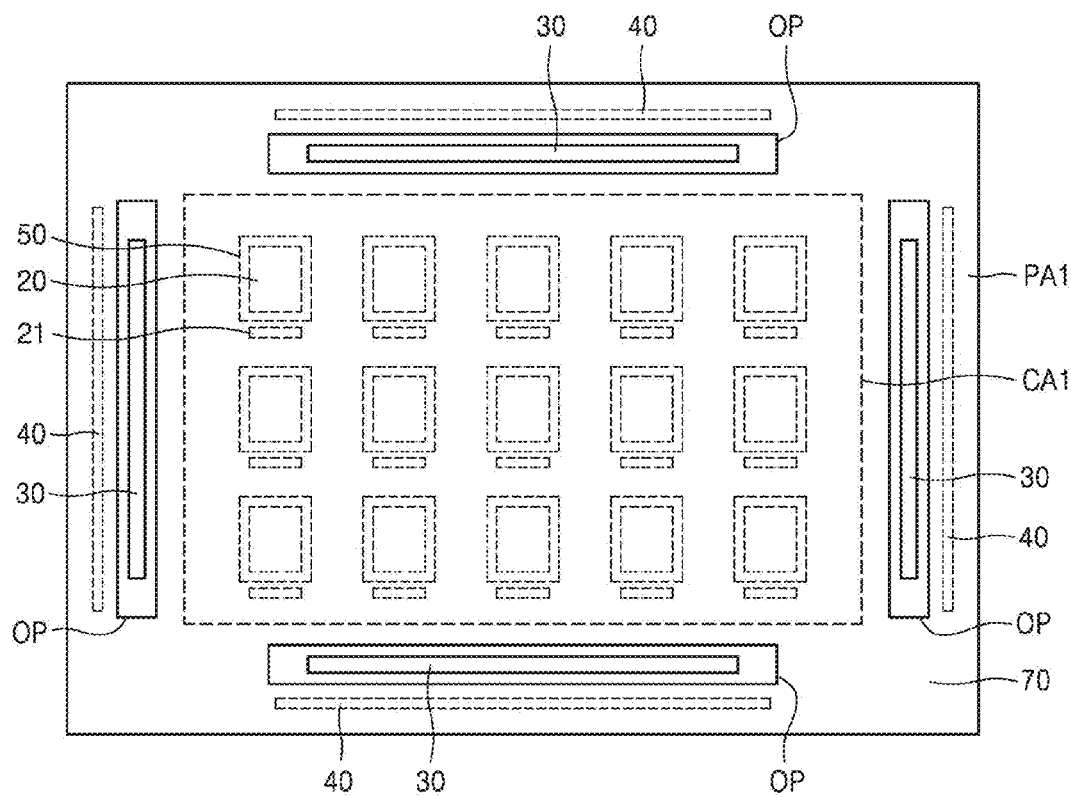
Figure 13:
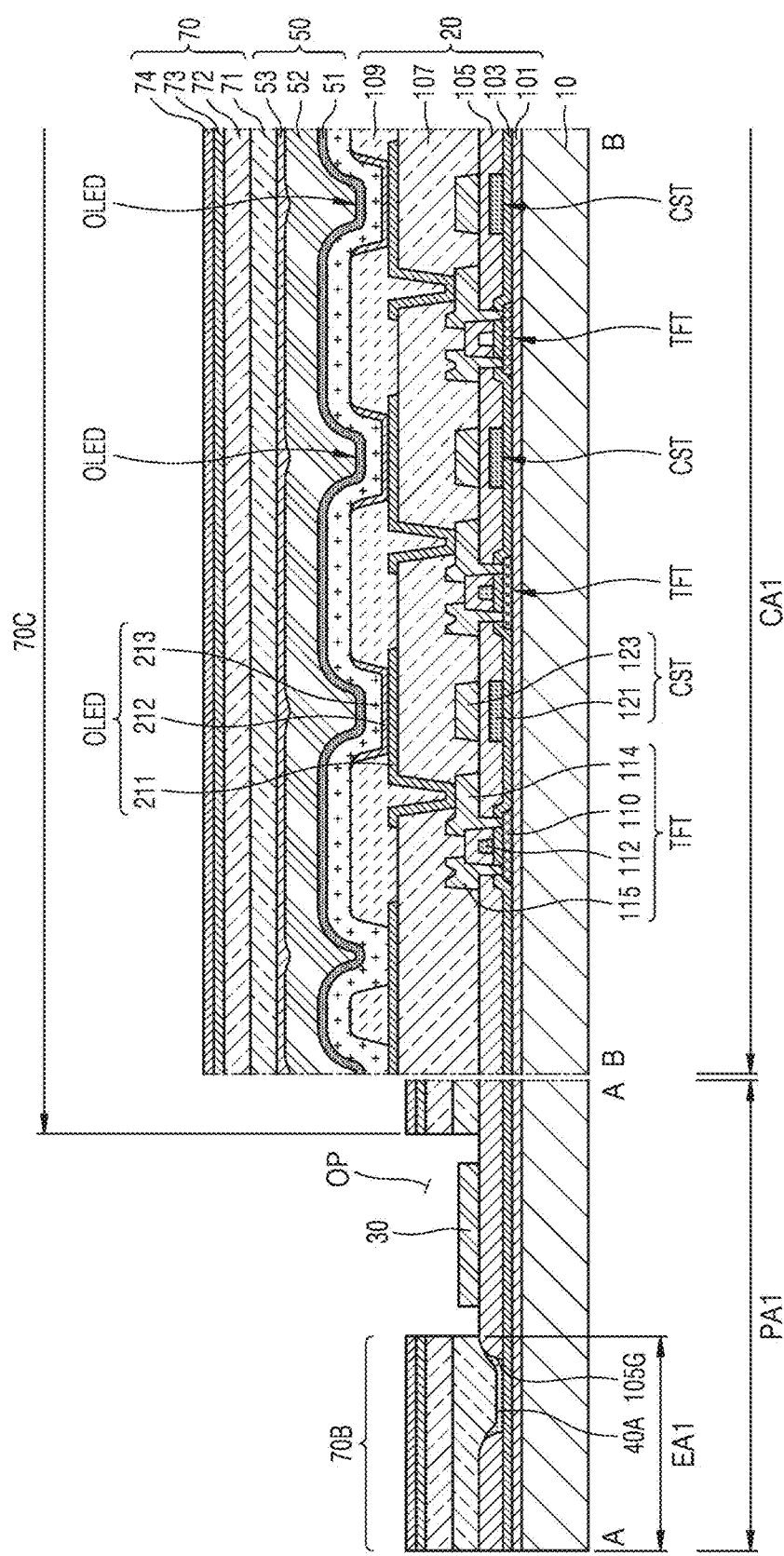

Referring to FIGS. 6 and 13, an opening OP is formed in the protective film 70 by removing the portion 70A (see FIG. 12) of the protective film 70 defined by the perimeter formed by auxiliary line AL. The second pad 30 is exposed via the opening OP. The exposed second pad 30 may be used as a pad for testing a mother substrate as described herein.

While the portion 70A of the protective film 70 is removed, exfoliation of insulating layers, for example, the interlayer insulating layer 105 and the gate insulating layer 103 may be prevented by a hardened pattern portion 40A below an end 70B of the protective film 70 adjacent to the portion 70A. For example, to remove the portion 70A of the protective film 70, force $F_L$ (see FIG. 12, referred to as lifting force) lifting the portion 70A is applied to the protective film 70. The interlayer insulating layer 105 and/or insulating layers therebelow coupled to a part of the first adhesive layer 71 corresponding to the portion 70A of the protective film 70 may exfoliate or separate from other layers adjacent thereto while being simultaneously lifted when the portion 70A of the protective film 70 is lifted. However, according to the principles of the invention, when the pattern portion 40A is melted and hardened, the pattern portion 40A contacts the interlayer insulating layer 105 and the gate insulating layer 103 around the concave portion 105G and increases the bonding force therebetween. Therefore, exfoliation of the insulating layers such as the interlayer insulating layer 105 as described above may thereby be partially or entirely prevented.

The pattern portion 40A may prevent damage to the end 70B of the protective film 70 in an end area EA1 of the flexible substrate 10. Of the non-removed parts of the protective film 70 adjacent to the portion 70A of the protective film 70, the end 70B of the protective film 70 in the end area EA1 between an end of the flexible substrate 10 and the second pad 30 has an area much smaller than that of the other portion 70C of the protective film 70 on the opposite side. For example, in the case where the auxiliary line AL is formed in a dashed line and a part of the end 70B of the protective film 70 is connected to the portion 70A of the protective film 70, while the portion 70A of the protective film 70 is removed, the end 70B of the protective film 70 may simultaneously receive lifting force. In this case, damage such as wrinkles to the end 70B of the protective film 70, the insulating layers adhering therebelow, and the flexible substrate 10 may be generated. However, because the pattern portion 40A is in the end area EA1 with predetermined strength, the above-mentioned damage may thereby be partially or completely prevented.

Figure 7:
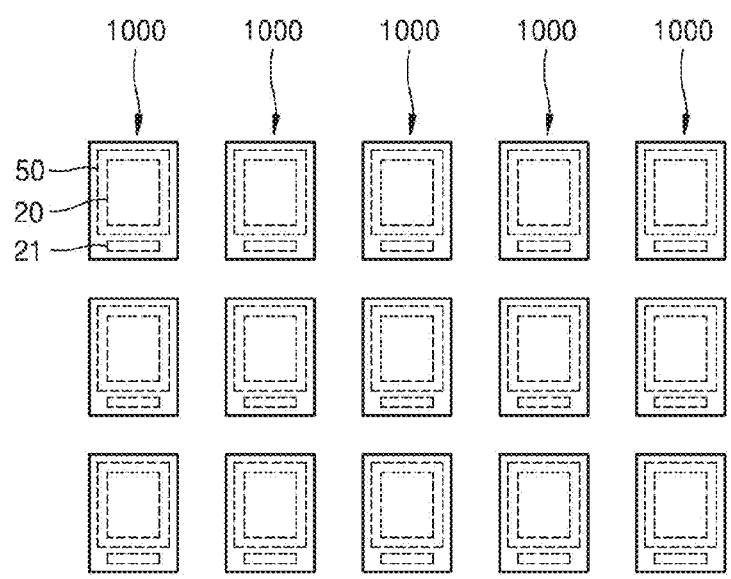

Referring to FIG. 7, a plurality of organic light-emitting displays 1000 are formed by cutting a display device which is a mother substrate illustrated in FIG. 6. A cutting process may be performed by using, for example, a laser cutter, a blade, or some other means known in the art.

The protective film 70 (see FIG. 13) of each of the organic light-emitting displays 1000 may be removed following the foregoing step of cutting. After the protective film 70 is removed, a touch film may be attached or an optical film such as a polarizing plate may be attached. Alternatively, the protective film 70 of each of the organic light-emitting displays 1000 might not be removed.

As described above with reference to FIGS. 1 to 14, the step of melting the pattern portion 40 by using a laser beam is performed before the protective film 70 is formed. However, those steps in the method of manufacturing the display may also be performed in different sequence.

Figure 16A:
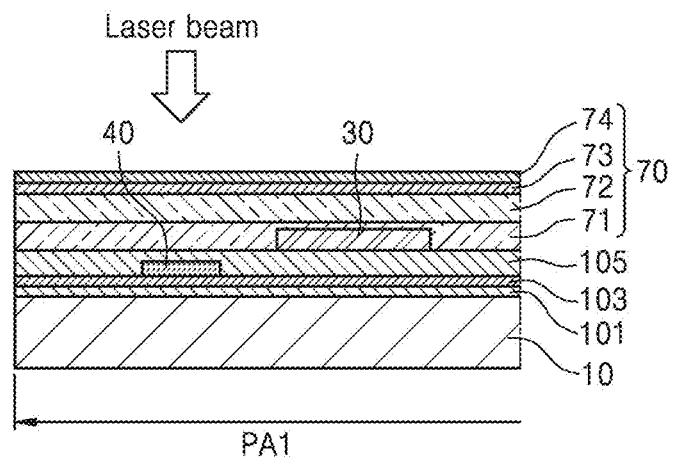
FIG. 16A to FIG. 16C are cross-sectional views of a peripheral area of the first embodiment of the flexible display device during various steps in a second embodiment of a method of manufacturing the flexible display device according to the principles of the invention.
Figure 16B:
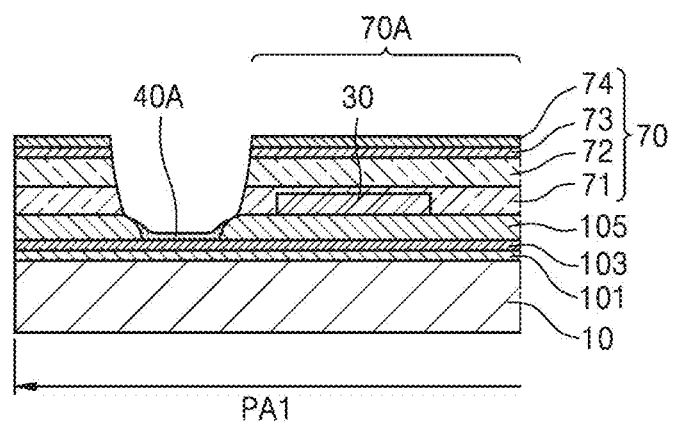
Figure 16C:
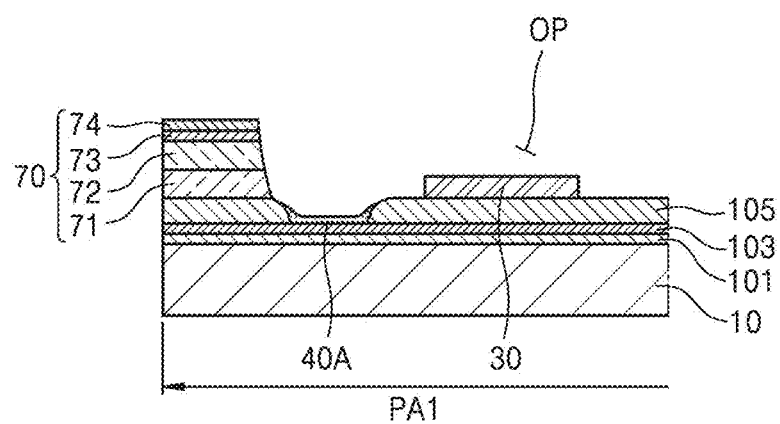

For example, referring to FIG. 16A to FIG. 16C, a laser beam may irradiate the pattern 40 after the protective film 70 is formed as indicated in FIG. 16A. When the laser beam is irradiated at a part of the protective film 70 corresponding to the pattern portion 40, that part of the protective film 70 and the interlayer insulating layer 105 below are removed by high heat of the laser beam as indicated in FIG. 16B. When the part of the interlayer insulating layer 105 is removed, the concave portion 105G is formed. At the same time, the pattern portion 40 is melted by the laser beam, may cover the sloped side(s) of the concave portion 105G, and may be hardened. After that, in the case where the portion 70A of the protective film 70 is removed as shown in FIG. 16C, exfoliation of the insulating layers is prevented by the hardened pattern portion 40A as described above. Also, since a partial region of the protective film 70 corresponding to the pattern portion 40A is removed by the laser beam, the portion 70A of the protective film 70 may be more easily removed without damage to the end 70B of the protective film 70 and the layers therebelow.

Though a case where the pattern portion 40A is formed in the display device, which is a mother substrate, has been described according to the embodiments with reference to FIGS. 1 to 14, 15, and 16A to 16C, the inventive concepts are not limited to the foregoing embodiments. For example, the pattern portion 40A may also be implemented in a display device such as an organic display device as indicated in FIG. 17 and FIG. 18.

Figure 17:
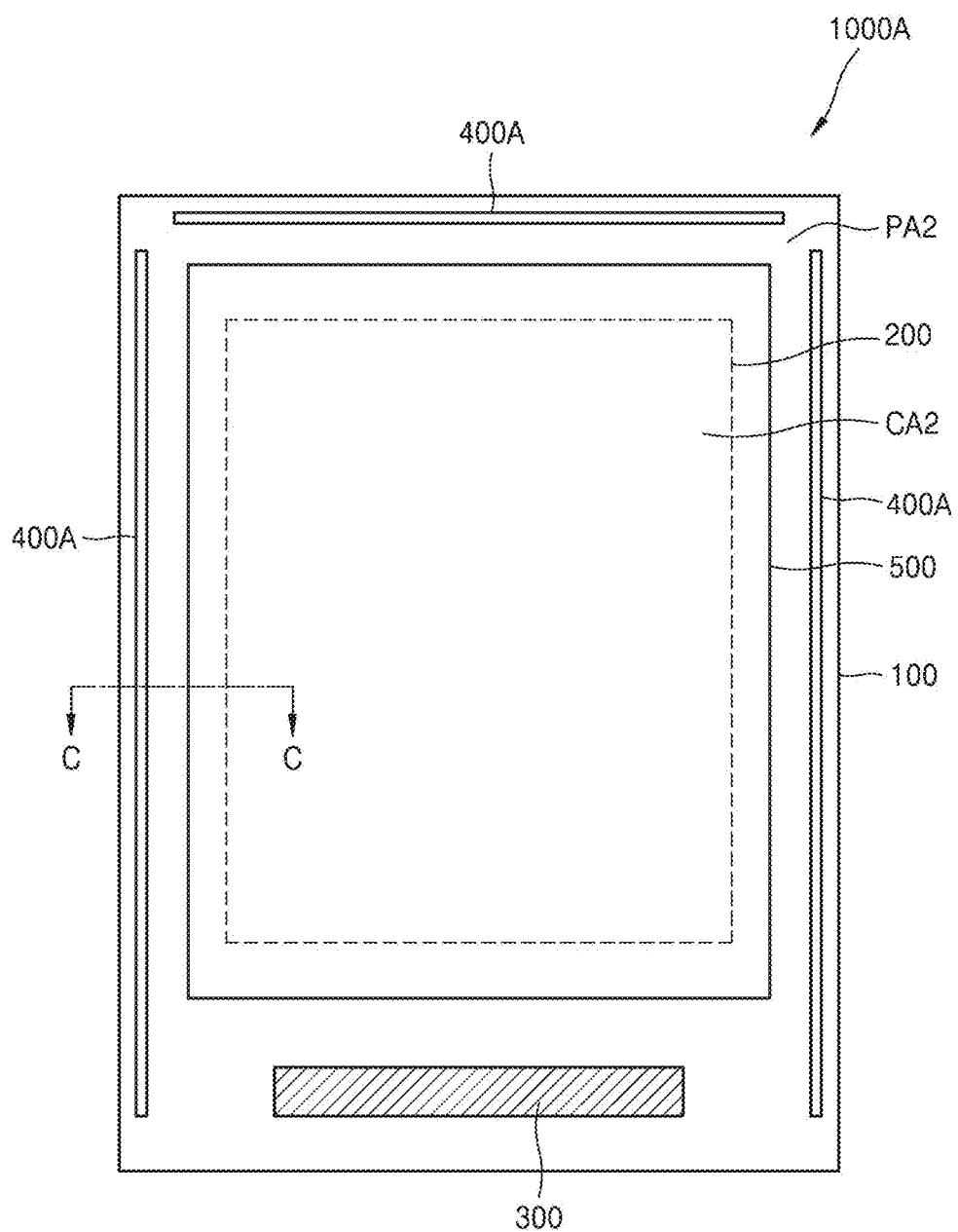
FIG. 17 is a plan view of a second embodiment of a display device constructed according to the principles of the invention as an organic light-emitting display.
Figure 18:
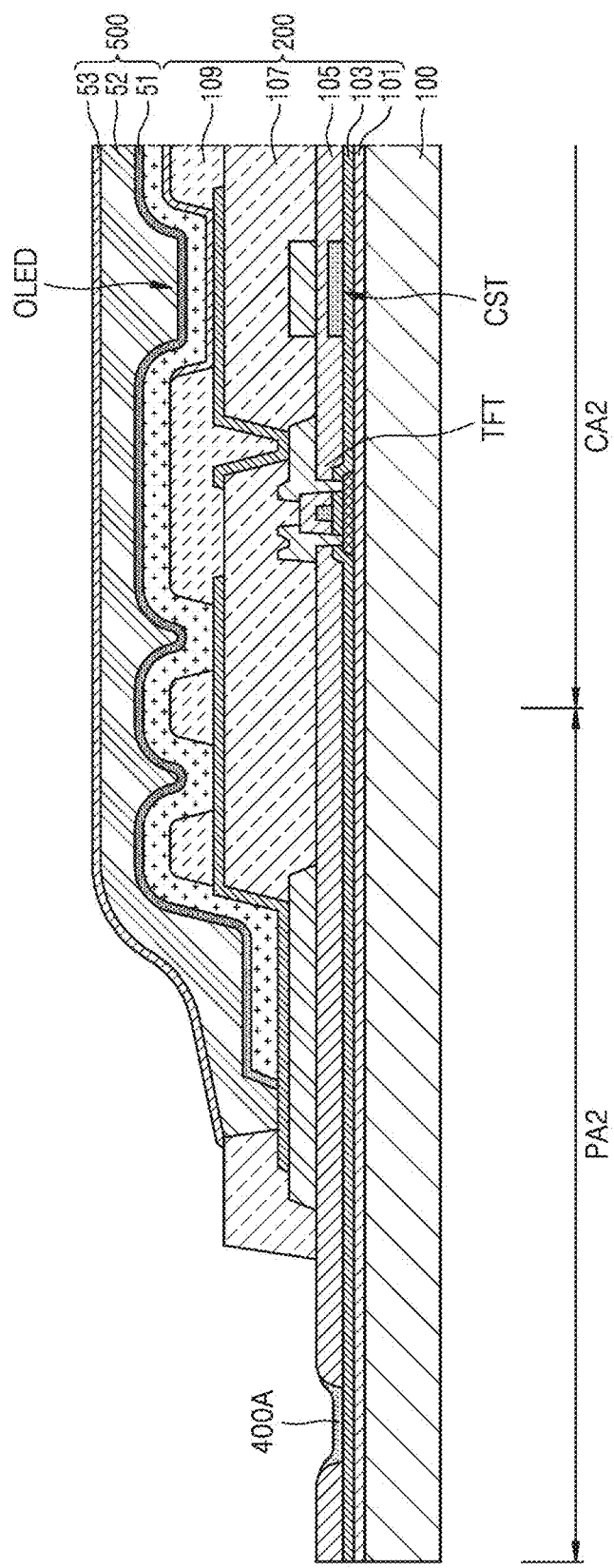
FIG. 18 is a cross-sectional view of the organic light-emitting display taken along sectional line C-C of FIG. 17.

Referring to FIGS. 17 and 18, the organic light-emitting display 1000A includes a display unit 200 in a central area CA2 of the flexible substrate 100, and a pad 300 in a peripheral area PA2, the display unit 200 being covered with an encapsulation thin layer 500. The pad 300 may be a pad for connecting to a printed circuit board, for example, an FPCB. The display unit 200 includes a plurality of pixels each including an OLED. Each OLED is electrically connected to a TFT and a storage capacitor Cst.

The organic light-emitting display 1000A is manufactured by the same process as that of the organic light-emitting display 1000 described with reference to FIG. 7. The organic light-emitting display 1000A corresponds to the organic light-emitting display 1000 described with reference to FIG. 7 from which the protective film has been removed. However, the organic light-emitting display 1000A may, alternatively, further include a pattern portion 400A in the peripheral area PA2.

The pattern portion 400A includes a metallic material. The pattern portion 400A may include the same material as that of one of the electrodes of the TFT and the storage capacitor Cst.

As described with reference to FIGS. 9 and 10, when the pattern portion 400A is melted by the laser beam and hardened, the pattern portion 400A contacts insulating layers, for example, a slope surface of the concave portion 105G of the interlayer insulating layer 105 and the gate insulating layer 103, and thereby creates or improves a bond between the interlayer insulating layer 105 and the gate insulating layer 103. As described above, when the protective film covering the organic light-emitting display 1000A is removed, the pattern portion 400A may prevent the insulating layers, for example, the interlayer insulating layer 105, the gate insulating layer 103, and so on, from exfoliating at the edge of the organic light-emitting display 1000A.

A touch film may also be attached or an optical film such as a polarizing plate may be attached on the encapsulation thin layer 500 as described above.

Figure 19:
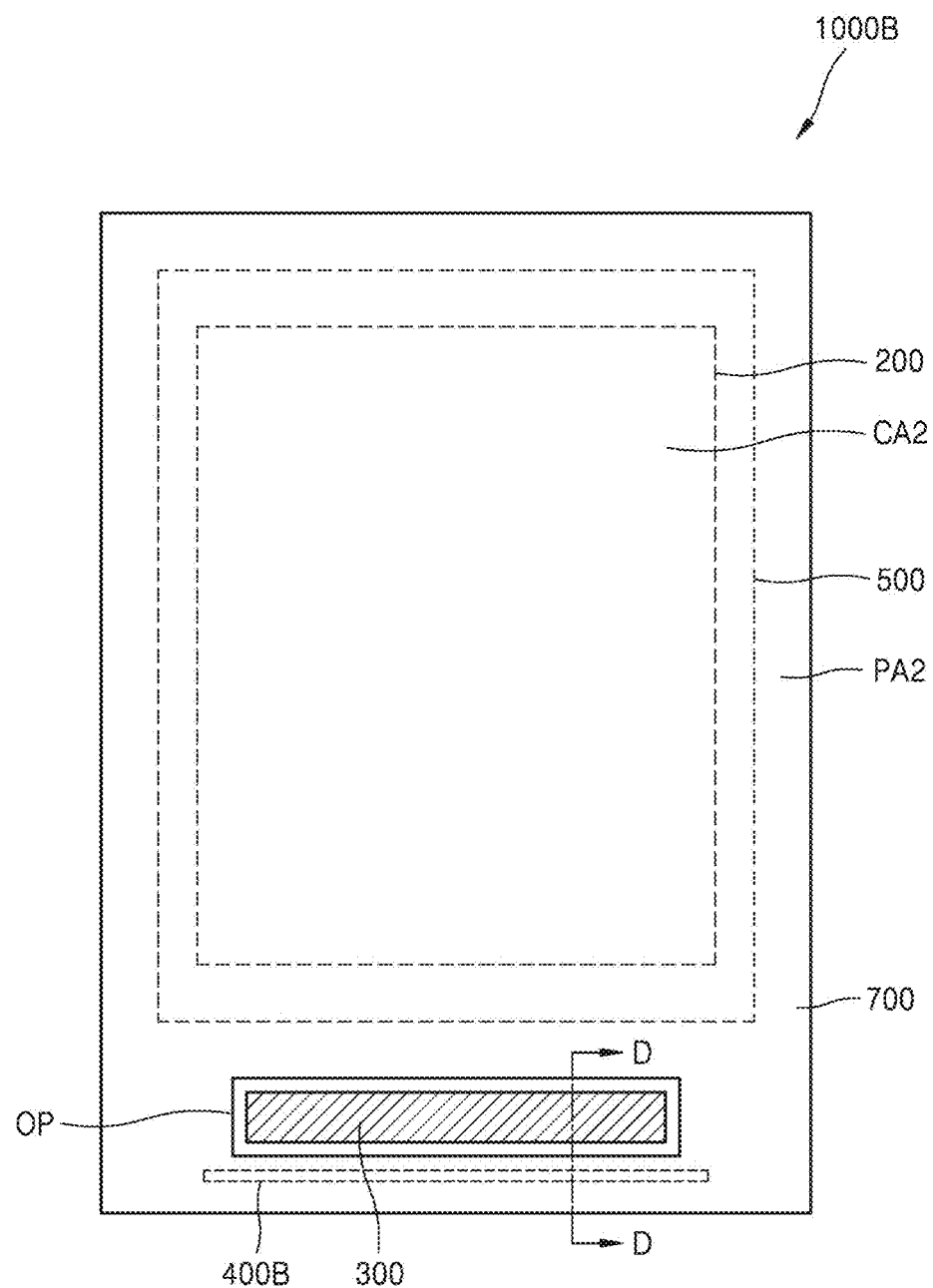
FIG. 19 is a plan view of a third embodiment of a display device constructed according to the principles of the invention as an organic light-emitting display which is.
Figure 20:
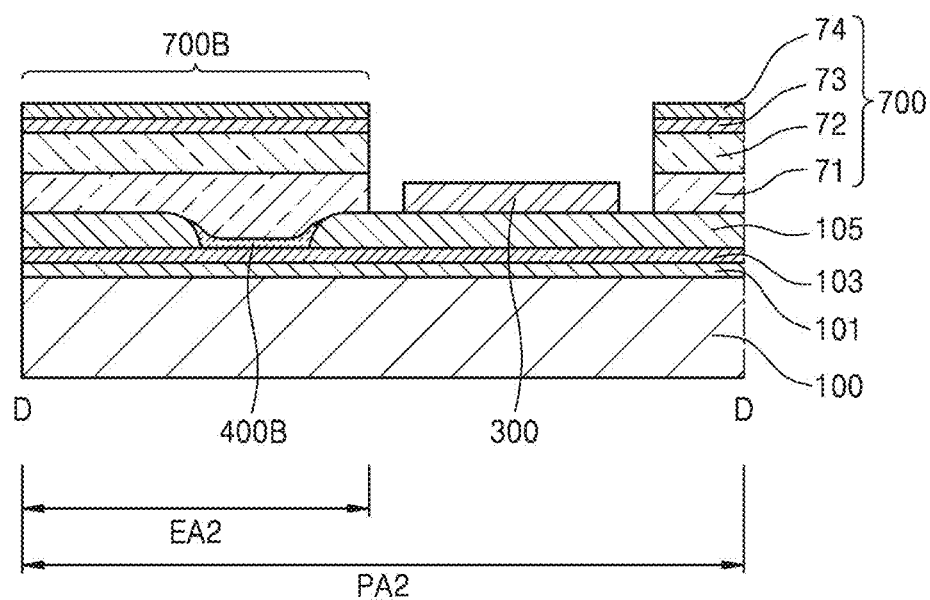
FIG. 20 is a cross-sectional view of the organic light-emitting display taken along sectional line D-D of FIG. 19.

Referring to the embodiment of FIGS. 19 and 20, the organic light-emitting display 1000B includes the display unit 200 in the central area CA2 of the flexible substrate and the pad 300 in the peripheral area, the display unit 200 being covered with the encapsulation thin layer 500.

The organic light-emitting display 1000B is manufactured by the same process as that of the organic light-emitting display 1000 described with reference to FIG. 7. The organic light-emitting display 1000B corresponds to the organic light-emitting display 1000 of FIG. 7. However, the organic light-emitting display 1000B may further include a protective film 700 having an opening OP exposing the pad 300, and a pattern portion 400B adjacent to an edge of the flexible substrate 100 closest to the opening OP.

The pattern portion 400B includes a metallic material. As described above, the pattern portion 400B may include the same material as that of one of the electrodes of the TFT and the storage capacitor.

As described with reference to FIGS. 9 and 10, when the pattern portion 400B is melted by the laser beam and hardened, the pattern portion 400B contacts insulating layers, for example, the sloped side(s) of the concave portion 105G of the interlayer insulating layer 105 and the gate insulating layer 103, and thereby creates or improves a bond between the interlayer insulating layer 105 and the gate insulating layer 103. When a portion of the protective film 700 is thereafter removed and the opening OP is thereby formed, the pattern portion 400B may prevent insulating layers, for example, the interlayer insulating layer 105, the gate insulating layer 103, and so on, from exfoliating at an edge of the organic light-emitting display 1000B.

Also, as described above, when a part of the protective film 700 is removed and the opening OP is formed, the pattern portion 400B may prevent damage such as wrinkles from being generated at the end 700B of the protective film in an end area EA2 between the end of the flexible substrate 100 and the pad 300.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:
1. A display device comprising:
a flexible substrate comprising a central area and a peripheral area surrounding the central area;
a display unit in the central area;
an encapsulation layer covering the display unit and including at least one inorganic layer and at least one organic layer;
an insulating layer disposed in the peripheral area and having a recess; and
a metallic material portion disposed inside the recess and covering at least a lower part of a slope surface and a bottom surface of the recess in a continuous manner,
wherein:
the metallic material portion has an irregular shape with a top surface that is rougher than a top surface of the insulating layer, and has a thickness that is gradually reduced from a bottom of the recess toward the slope surface; and the slope surface of the recess has a curved shape.

2. The display device of claim 1, wherein the metallic material portion is adjacent to an edge of the flexible substrate.

3. The display device of claim 1, wherein a portion of the insulating layer adjacent the recess comprises a thermally denaturalized portion.

4. The display device of claim 1, further comprising an additional insulating layer below the metallic material portion, the metallic material portion contacting an upper surface of the additional insulating layer.

5. The display device of claim 1, further comprising a protective film disposed over the flexible substrate and covering the encapsulation layer.

6. The display device of claim 5, wherein the protective film has an opening adjacent to the metallic material portion.

7. The display device of claim 6, further comprising a pad in the peripheral area, the pad being exposed via the opening of the protective film.

8. The display device of claim 1, wherein the display unit comprises:

a pixel circuit comprising a thin film transistor and a storage capacitor, the thin film transistor including a semiconductor layer, a gate electrode, a source electrode, and a drain electrode, and the storage capacitor including a first electrode and a second electrode; and a display element connected to the pixel circuit.

9. The display device of claim 8, wherein the metallic material portion comprises the same material as that of at least one of the gate electrode, the source electrode, the drain electrode, and the first electrode, and the second electrode.

10. The display device of claim 1, wherein the display unit comprises a plurality of pixels each comprising an organic light-emitting diode.

11. The display device of claim 1, the metallic material portion has a rough surface on an entire top surface.

* * * * *